US012677656B2

(12) United States Patent
Cheng et al.

(10) Patent No.: US 12,677,656 B2
(45) Date of Patent: Jul. 7, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Kai-I Cheng, Tainan (TW); Jen-Pan Wang, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 259 days.

(21) Appl. No.: 18/352,465

(22) Filed: Jul. 14, 2023

(65) Prior Publication Data

US 2025/0022793 A1     Jan. 16, 2025

(51) Int. Cl.
H10W 20/40      (2026.01)
H10D 1/00       (2025.01)
H10D 1/68       (2025.01)

(52) U.S. Cl.
CPC .......... H10W 20/496 (2026.01); H10D 1/042 (2025.01); H10D 1/714 (2025.01)

(58) Field of Classification Search
CPC . H01L 23/5223; H01L 23/5226; H10D 1/042; H10D 1/714; H10W 20/496; H10W 20/42
See application file for complete search history.

(56) References Cited

U.S. PATENT DOCUMENTS

2021/0013301 A1*   1/2021   Huang ..................... H10D 1/68
2021/0398992 A1*  12/2021   Wu ....................... H10D 64/033

* cited by examiner

*Primary Examiner* — Patricia D Valenzuela
(74) *Attorney, Agent, or Firm* — Ingrassia Fisher & Lorenz, LLP | IFL

(57)          ABSTRACT

A fabrication method is disclosed. The fabrication method includes: forming, on a substrate, a transistor comprising a source, drain, and gate; forming a multi-layer interconnection structure configured to provide electrical connections for the source, drain, and gate, wherein the multi-layer interconnection structure has a plurality of interconnection layers; forming a metal-insulator-metal (MiM) capacitor in the interconnection structure, the MiM capacitor comprising a first electrode, a high-K spacer with a first vertically-extending sidewall and a second vertically-extending sidewall wherein the first vertically-extending sidewall has a vertically extending interface with the first electrode, and a second electrode wherein the second vertically-extending sidewall has a vertically extending interface with the second electrode; forming a first conductive feature that connects to the first electrode; and forming a second conductive feature that connects to the second electrode.

20 Claims, 9 Drawing Sheets

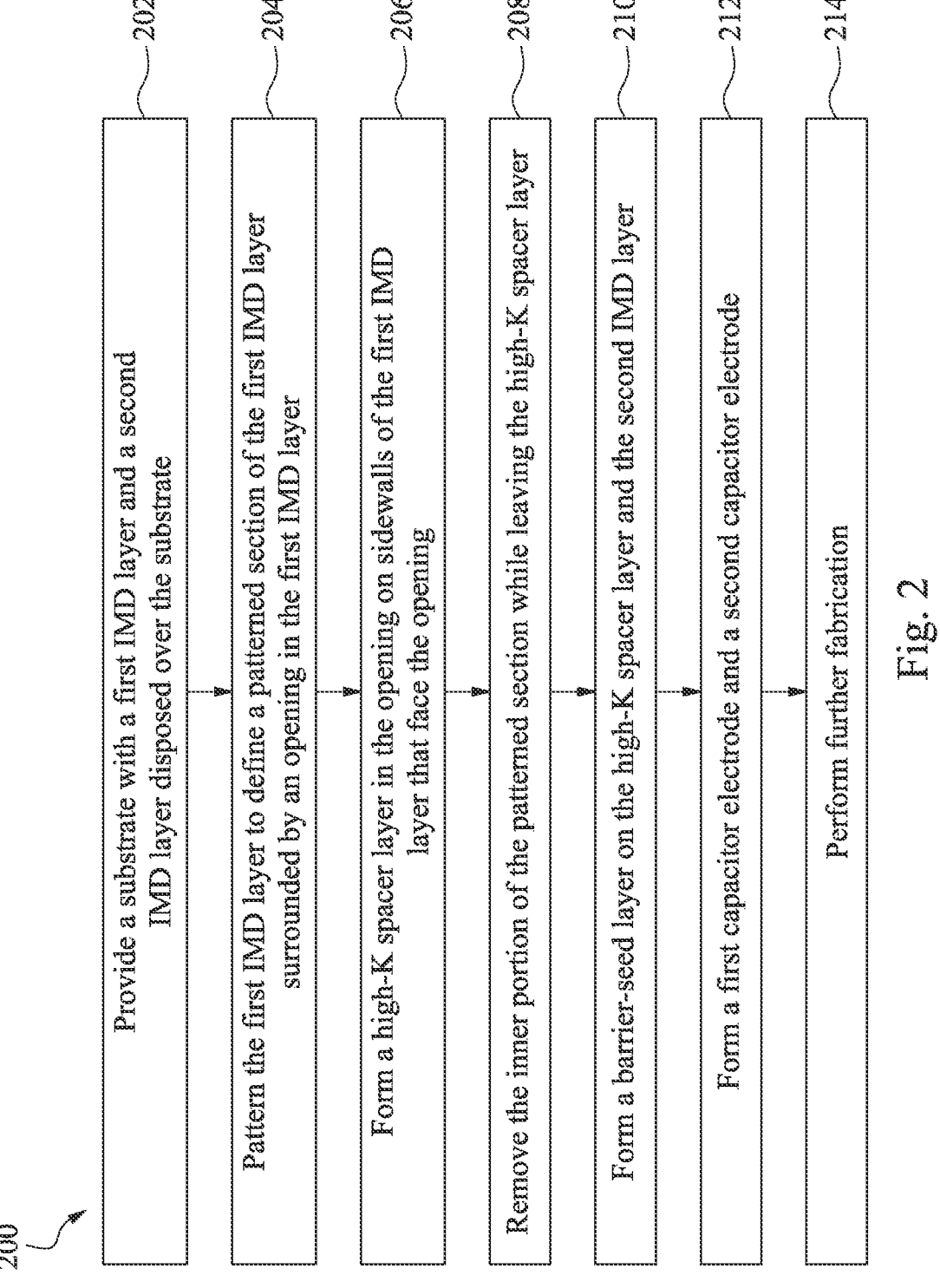

200

202 Provide a substrate with a first IMD layer and a second IMD layer disposed over the substrate 204 Pattern the first IMD layer to define a patterned section of the first IMD layer surrounded by an opening in the first IMD layer 206 Form a high-K spacer layer in the opening on sidewalls of the first IMD layer that face the opening 208 Remove the inner portion of the patterned section while leaving the high-K spacer layer 210 Form a barrier-seed layer on the high-K spacer layer and the second IMD layer 212 Form a first capacitor electrode and a second capacitor electrode 214 Perform further fabrication

Fig. 2

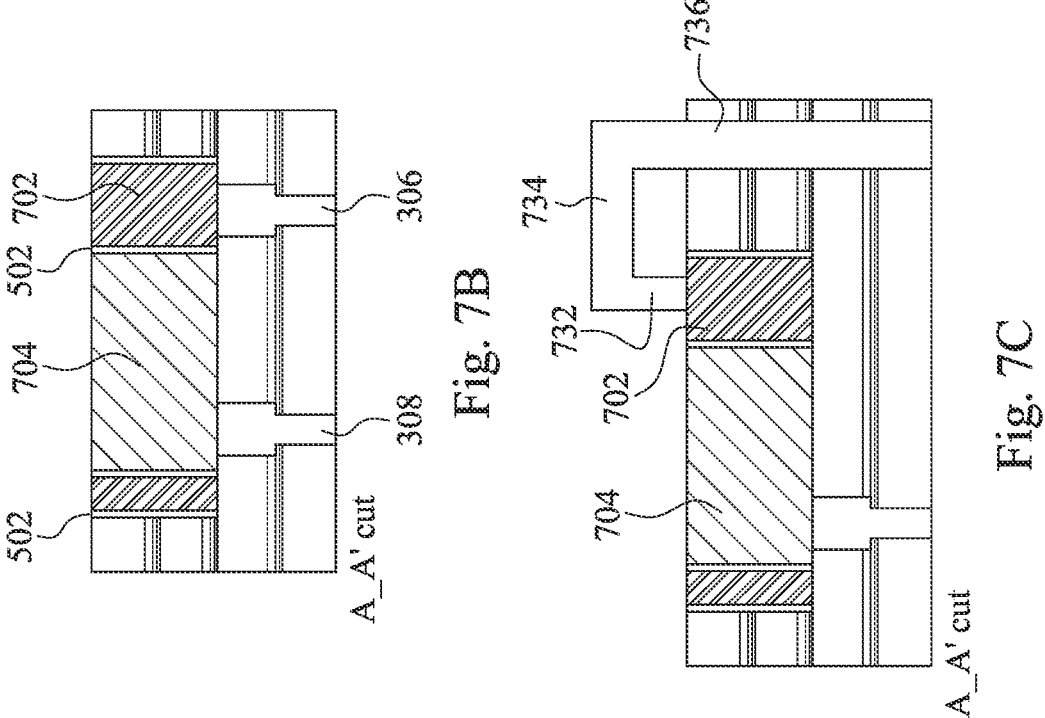
Fig. 7B
Fig. 7C
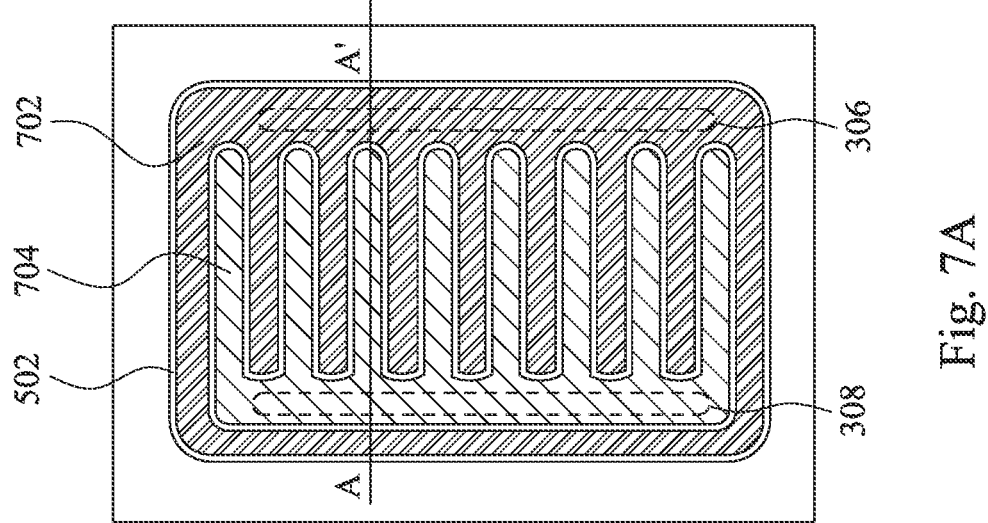
Fig. 7A

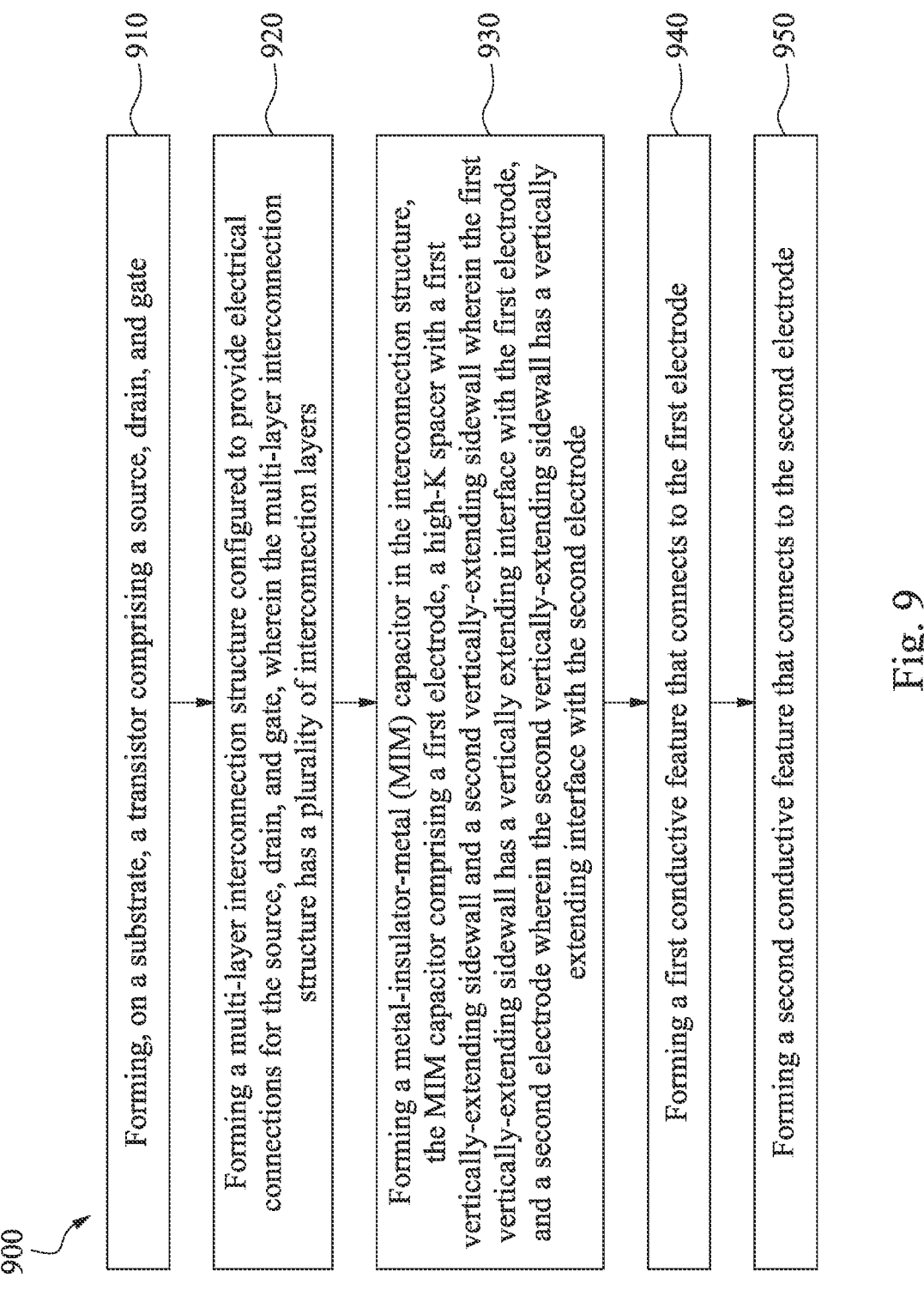

900

910 Forming, on a substrate, a transistor comprising a source, drain, and gate

920 Forming a multi-layer interconnection structure configured to provide electrical connections for the source, drain, and gate, wherein the multi-layer interconnection structure has a plurality of interconnection layers 930 Forming a metal-insulator-metal (MIM) capacitor in the interconnection structure, the MIM capacitor comprising a first electrode, a high-K spacer with a first vertically-extending sidewall and a second vertically-extending sidewall wherein the first vertically-extending sidewall has a vertically extending interface with the first electrode, and a second electrode wherein the second vertically-extending sidewall has a vertically extending interface with the second electrode 940 Forming a first conductive feature that connects to the first electrode 950 Forming a second conductive feature that connects to the second electrode

Fig. 9

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

One type of capacitor is a metal-insulator-metal (MIM) capacitor, which is used in mixed signal devices and logic devices, such as embedded memories and radio frequency devices. Metal-insulator-metal capacitors are used to store charges in a variety of semiconductor devices. However, there are many challenges related to the MIM capacitor.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a process flow chart depicting an example process for forming a vertical MIM capacitor, in accordance with various embodiments.

FIGS. 3A, 4A, 5A, 6A, 7A, 8A, and 8B are plan (or top) views of an example semiconductor structure during various phases of fabricating a vertical MIM capacitor, in accordance with various embodiments.

FIGS. 3B, 4B, 5B, 6B, 7B, and 7C are cross sectional views of the example semiconductor structure along an A_A' cut line during various phases of fabricating the vertical MIM capacitor, in accordance with various embodiments.

FIG. 9 is a flowchart of an example process for forming a semiconductor device having a vertical MIM capacitor, in accordance with various embodiments.

DETAILED DESCRIPTION

Figure 1:
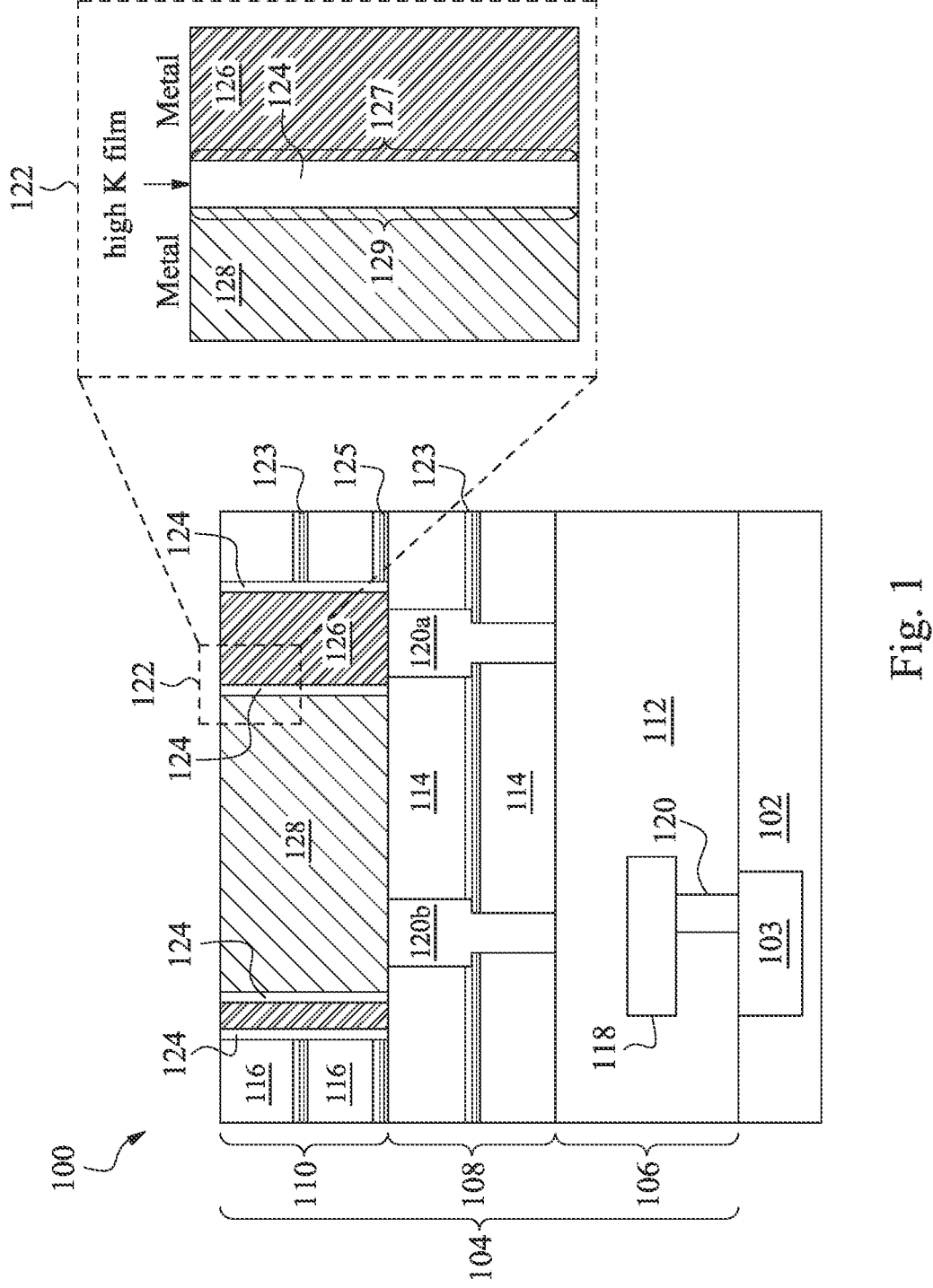
FIG. 1 is a cross-sectional view of a portion of an example semiconductor device at one stage in an integrated circuit manufacturing process in accordance with various embodiments.
Figure 3B:
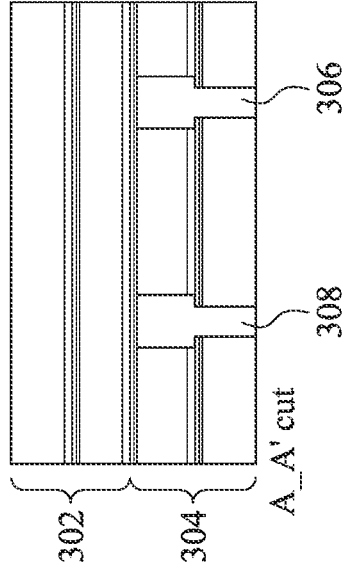
Figure 3A:
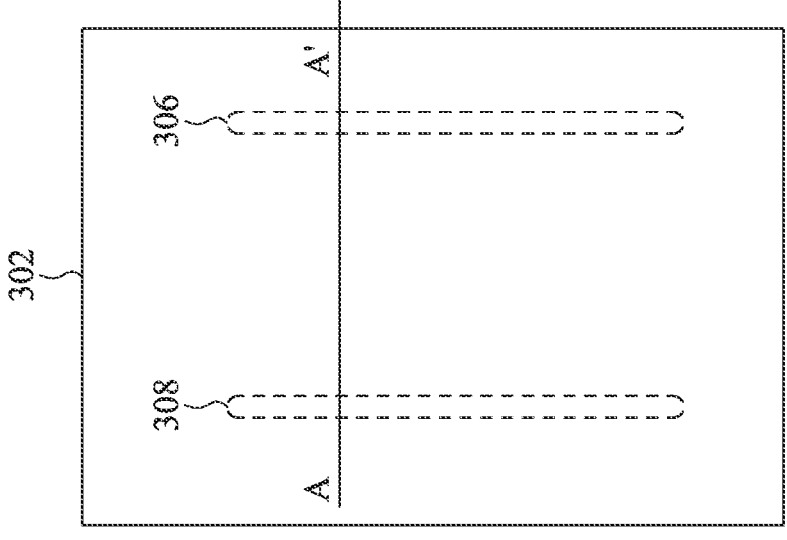

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer, or section. Thus, a first element, component, region, layer, portion, or section discussed below could be termed a second element, component, region, layer, portion, or section without departing from the teachings of the present disclosure.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

In certain embodiments herein, a "material layer" is a layer that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a layer that is a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of an aluminum layer and a layer of aluminum is a layer that is at least 50 wt. %, at least 60 wt. %, at least 75 wt. %, at least 90 wt. %, at least 95 wt. %, or at least 99 wt. % of aluminum.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

FIG. 1 is a cross-sectional view of a portion of an example semiconductor device 100 at one stage in an integrated circuit manufacturing process in accordance with various embodiments. The example semiconductor device 100 includes a substrate 102 and an interconnect structure 104.

The substrate 102 can include any number of conductive features and device elements 103 formed in and/or over the semiconductor substrate. Conductive features can include, for example, plugs, interconnects, wiring lines, etc. Device elements 103 can include, for example, transistors, diodes, capacitors, etc. For example, the transistors may be metal oxide semiconductor field effect transistors (MOSFETs), complementary metal oxide semiconductor (CMOS) transistors, bipolar junction transistors (BJT), high-voltage transistors, high-frequency transistors, p-channel field effect transistors (PFETs) and/or n-channel field effect transistors (NFETs), diodes, or other suitable elements. In various embodiments, a transistor comprises a source, a drain, a gate electrode, a gate dielectric, and a channel. The substrate 102 may further include isolation features (not shown), such as shallow trench isolation (STI) features or local oxidation of silicon (LOCOS) features. The isolation features may define and isolate the various device elements.

The interconnect structure 104 provides routing and electrical connections between devices elements 103 formed in and/or over the substrate 102. The interconnect structure 104 may include a plurality of insulating layers—a first insulating layer 106, a second insulating layer 108, and a third insulating layer 110 are shown in the example of FIG. 1. The example first, second, and third insulating layers 106, 108, 110, respectively include a first inter-metal dielectric (IMD) layer 112, a second IMD layer 114, and a third IMD layer 116, and may include one or more conductive features, which in this example include metal lines 118 and/or VIAs 120 formed therein in a metallization layer. The conductive features may be electrically connected to active and/or passive devices of the substrate 102 by contacts (not shown in the figures).

In various embodiments, the interconnect structure 104 electrically connects the source, drain, gate electrode, date dielectric, and/or a channel of a transistor, and other features of the substrate to other features or devices on the substrate or within the interconnect structure 104.

In some embodiments, the interconnect structure 104 may be formed using a single and/or a dual damascene process, a VIA-first process, or a metal-first process. In an embodiment, insulating layers and openings (not shown) may be formed therein using acceptable photolithography and etching techniques. The first, second, and third IMD layers 112, 114, 116 may, for example, be or comprise an oxide film, such as silicon oxide, undoped silicon glass (USG), fluorosilicate glass (FSG), boron doped silicate glass (BSG), phosphosilicate glass (PSG), boron phosphorous-doped silicate glass (BPSG), polyethylene oxide (PEOX), thermal oxide, silicon dioxide ($SiO_2$), or another suitable dielectric material. One or more of the IMD layers 112, 114, 116 may be made of low dielectric constant (low-k) materials, such as a dielectric constant of less than about 3.0, or less than about 2.5. One or more of the IMD layers 112, 114, 116 may include a middle etch stop layer 123 and/or a bottom etch stop layer 125.

Conductive material for the metal lines 118 and/or VIAs 120 may be formed in the openings in the IMD layers from conductive material, such as copper (Cu), aluminum (Al), tungsten (W), nickel (Ni), cobalt (Co), silver (Ag), titanium (Ti), titanium nitride (TiN), gallium (Ga), zinc (Zn), ruthenium (Ru), molybdenum (Mo), indium tin oxide (ITO), combinations thereof, or other applicable materials, and may be formed in the openings using an electro-chemical plating process, chemical vapor deposition (CVD), atomic layer deposition (ALD), physical vapor deposition (PVD), the like, or a combination thereof. After formation of the conductive material, excess conductive material may be removed using, for example, a planarization process such as chemical mechanical polishing (CMP), thereby leaving conductive features in the openings of an insulating layer. The process may then be repeated to form additional insulating layers and conductive features therein. The interconnect structure 104 shown in FIG. 1 is merely for illustrative purposes. The interconnect structure 104 may include other configurations and may include one or more metal lines and IMD layers.

The example interconnect structure 104 also includes a MIM capacitor 122 formed in openings in an IMD layer (e.g., third IMD layer 116) and over the substrate 102. The example MIM capacitor 122 has a vertical sandwich structure wherein an insulating layer 124 is formed between a first capacitor metal layer 126 and a second capacitor metal layer 128. The interface of the first capacitor metal layer 126 and the insulating layer 124 and the interface of the second capacitor metal layer 128 and the insulating layer 124 each extend substantially in a vertical (e.g., z-axis) direction. In various embodiments, the vertical MIM capacitor can provide a higher capacitance in the same surface area of an integrated circuit as a horizontal MIM capacitor.

In various embodiments, the first capacitor metal layer 126 and the second capacitor metal layer 128 are formed from a metal such as copper (Cu), and the insulating layer 124 is formed from a high permittivity (high-K) dielectric material (e.g., with a relative permittivity greater than about 3). High-K dielectric materials, as used and described herein, include dielectric materials having a high dielectric constant, for example, greater than that of thermal silicon oxide (~3.9). The insulating layer 124 with the high-K dielectric material may be formed by ALD, physical vapor deposition (PVD), CVD, chemical oxidation, thermal oxidation, and/or other suitable methods.

In various embodiments, the MiM capacitor 122 includes a first electrode (e.g., first capacitor metal layer 126), a high-K spacer (e.g., insulating layer 124) with a first vertically-extending sidewall 127 and a second vertically-extending sidewall 129 wherein the first vertically-extending sidewall 127 has a vertically extending interface with the first electrode (e.g., first capacitor metal layer 126), and a second electrode (e.g., second capacitor metal layer 128) wherein the second vertically-extending sidewall 129 has a vertically extending interface with the second electrode (e.g., second capacitor metal layer 128). In various embodiments, the high-K spacer comprises Si, O, N, Cu, Mn, C, Al, Ti, Ta, HfO, HfO$_2$, SiO$_2$, TaO, Ta$_2$O$_5$, AlO, Al$_2$O$_3$, SiN, ZrO, ZrO$_2$, or TiO. In various embodiments, the high-K spacer (e.g., insulating layer 124) includes a multi-layer structure. In various embodiments, the high-K spacer (e.g., insulating layer 124) has a thickness of about 1 nm to 100 nm.

In various embodiments, a first conductive feature 120a (e.g., a VIA) connects to the first electrode (e.g., first capacitor metal layer 126), and a second conductive feature 120b (e.g., a VIA) connects to the second electrode (e.g., second capacitor metal layer 128). In this example, the first conductive feature 120a and the second conductive feature 120b are formed at the same interconnection layer in the interconnection structure 104. In various embodiments, the first conductive feature and the second conductive feature are formed at different layers in the interconnection structure.

FIG. 2 is a process flow chart depicting an example process for 200 for forming a vertical MIM capacitor, in accordance with various embodiments. FIG. 2 is described in conjunction with FIGS. 3A-8B. FIGS. 3A, 4A, 5A, 6A, 7A, 8A, and 8B are plan (or top) views of an example semiconductor structure during various phases of fabricating a vertical MIM capacitor, in accordance with various embodiments of the present disclosure of the example process 200, and FIGS. 3B, 4B, 5B, 6B, 7B, and 7C are cross sectional views of the example semiconductor structure along a A_A' cut line during various phases of fabricating the vertical MIM capacitor, in accordance with various embodiments of the present disclosure of the example process 200. In some figures, some reference numbers of components or features illustrated therein may be omitted to avoid obscuring other components or features; this is for ease of depicting the figures.

The process 200 is merely an example, and is not intended to limit the present disclosure beyond what is explicitly recited in the claims. Additional steps may be provided before, during, and after example process 200, and some of the steps described can be moved, replaced, or eliminated for additional embodiments of example process 200. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 200, including any descriptions given with reference to the Figures are merely exemplary and are not intended to be limiting beyond what is specifically recited in the claims that follow.

At block 202, the example process 200 includes providing a substrate with a first intermetal dielectric (IMD) layer disposed over the substrate. Referring to the example of FIGS. 3A and 3B, in an embodiment after completion of block 202, a substrate is provided with a first IMD layer 302 disposed over the substrate and a second IMD layer 304 with conductor lines (e.g., VIA 306 and VIA 308) disposed between the substrate and the first IMD layer 302.

At block 204, the example process 200 includes patterning the first IMD layer to expose a patterned section of the first IMD layer surrounded by an opening in the first IMD layer. The opening extends from the top of the first IMD layer to the bottom of the first IMD layer, and defines a first area into which a first MIM capacitor terminal is to be formed. In various embodiments, the opening exposes a conductive element, e.g., a VIA, in a second IMD layer below the first IMD layer. Various different layout styles may be applied to the patterned section of the first IMD layer, such as a single comb-shape, a dual comb-shape, or a spiral shape.

Figure 4B:
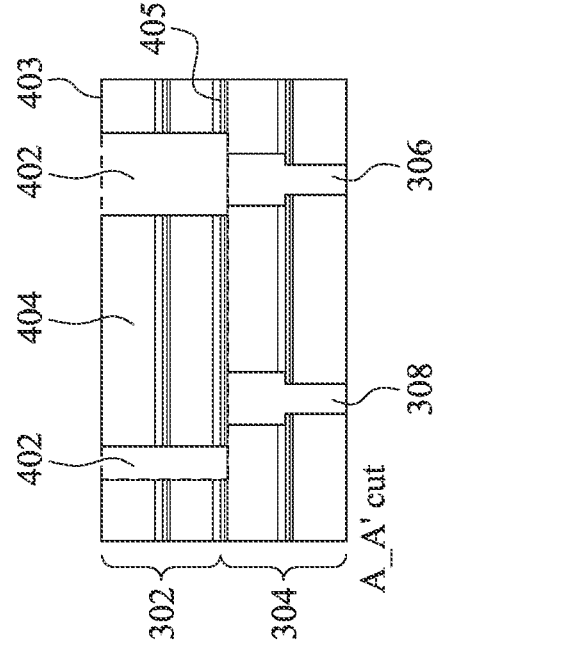
Figure 4A:
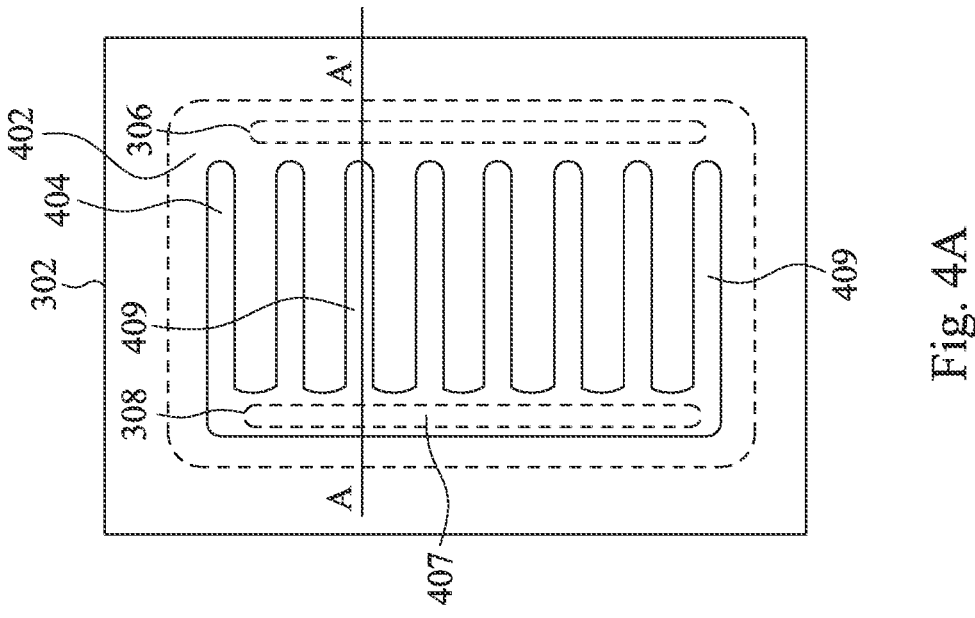
Figure 5B:
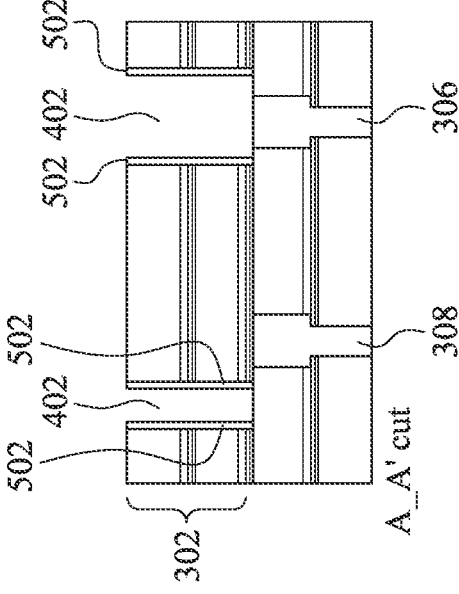
Figure 5A:
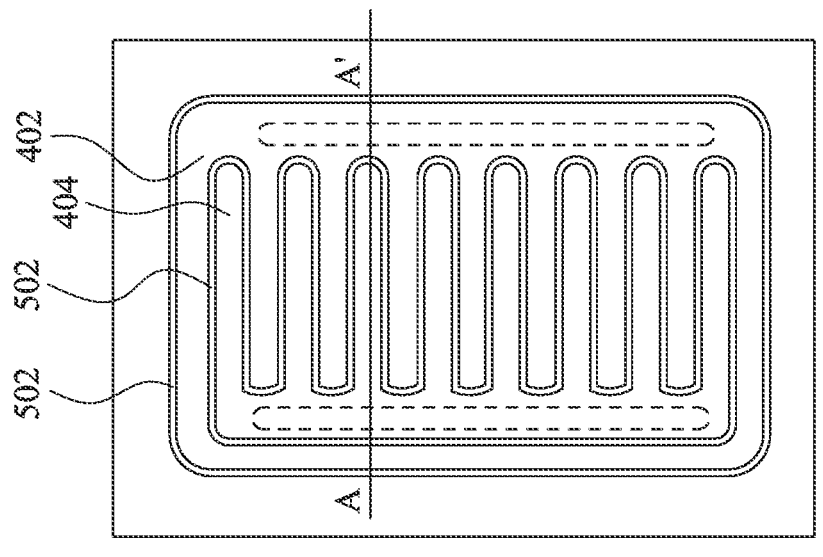

Referring to the example of FIGS. 4A and 4B, in an embodiment after completion of block 204, the first IMD layer 302 has an opening 402 that that surrounds a patterned section 404 of the first IMD layer 302. The opening 402 extends from the top 403 of the first IMD layer 302 to a bottom etch stop layer 405 of the first IMD layer 302, and defines a first area (patterned section 404) into which a first MIM capacitor terminal is to be later formed. In various embodiments, the opening 402 exposes a conductive element (e.g., a VIA 306) in the second IMD layer 304 below the first IMD layer 302. Various different layout styles may be applied to the patterned section 404 of the first IMD layer 302, such as a single comb-shape, a dual comb-shape, or a spiral shape. In the example of FIG. 4A, a single comb-shaped layout style is employed. The single comb-shaped layout style includes a body portion 407 with a plurality of teeth 409 extending in parallel (or approximately in parallel) from the body portion 407.

In various embodiments, the forming the opening 402 comprises using photolithographic techniques to define the pattern of the patterned section 404 and using isotropic etching techniques to remove material from the first IMD layer 302 around the patterned section 404 to form the opening 402. In various embodiments, the photolithographic techniques include forming a first patterned photo resist (PR) layer over the first IMD layer 302, patterning the first IMD layer 302 through isotropic etching operations using the patterned PR layer as a mask to form the patterned section 404, and removing the patterned PR layer.

At block 206, the example process 200 includes forming a high-K spacer layer in the opening on sidewalls of the first IMD layer that face the opening. The high-K spacer layer may be formed on the sidewalls using various deposition techniques such as chemical vapor deposition (CVD) techniques or physical vapor deposition (PVD) techniques such as sputtering. In various embodiments, the high-K spacer layer is formed from high-K dielectric materials such as Si, O, N, Cu, Mn, C, Al, Ti, Ta, HfO, $HfO_2$, $SiO_2$, TaO, $Ta_2O_5$, AlO, $Al_2O_3$, SiN, ZrO, $ZrO_2$, or TiO. In various embodiments, the high-K spacer layer is formed to a thickness such as 1 nm to 100 nm. In various embodiments, the high-K spacer layer has a relative permittivity greater than about 3. Referring to the example of FIGS. 5A and 5B, in an embodiment after completion of block 206, a high-K spacer layer 502 is formed around sidewalls of the first IMD layer 302 that face the opening 402.

At block 208, the example process 200 includes removing the inner portion of the patterned section while leaving the high-K spacer layer. The inner portion of the patterned section may be removed using suitable etching techniques such as isotropic etching and/or dry etching techniques.

At block 210, the example process 200 includes forming a barrier-seed layer on the high-K spacer layer and the second IMD layer. In various embodiments the barrier-seed layer is formed by an atomic layer deposition (ALD) process followed by flattening operations such as chemical mechanical polishing (CMP) to remove the barrier-seed layer from surfaces of the first IMD layer. In various embodiments, the barrier-seed layer is formed from a suitable barrier-seed material such as Titanium nitride (TiN), Tantalum nitride (TaN), or others.

Figure 6B:
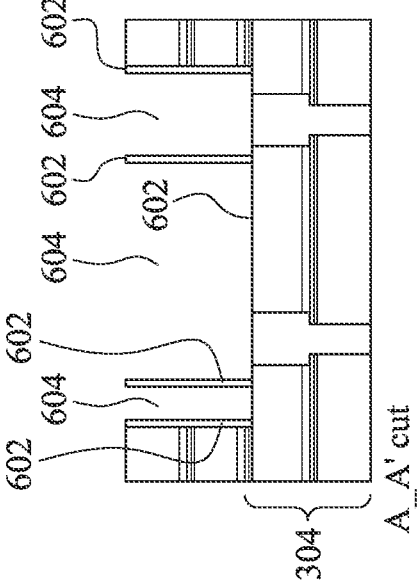
Figure 6A:
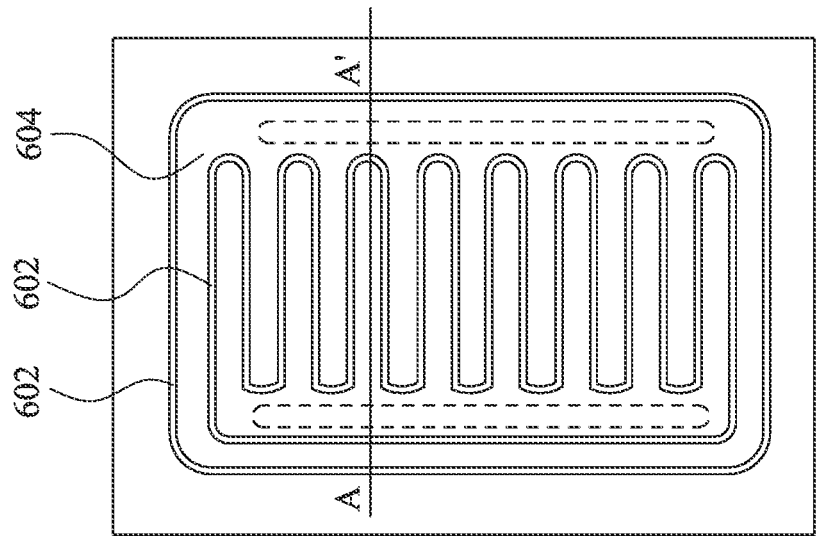

Referring to the example of FIGS. 6A and 6B, in an embodiment after completion of blocks 208 and 210, the high-K spacer layer 502 remains while the inner portion of the patterned section has been removed. A barrier-seed layer 602 has been formed on the high-K spacer layer 502 and a top surface of the second IMD layer 304 thereby defining a trench 604.

At block 212, the example process includes filling the trench with conductor material thereby forming a first capacitor electrode and a second capacitor electrode. In various embodiments, the trench is filled by depositing a metal material, such as Cu, into the trench. In various the metal material is deposited by CVD, PVD, and or sputtering followed by flattening operations such as CMP.

Referring to the example of FIGS. 7A and 7B, in an embodiment after completion of block 212, a first capacitor electrode 702 and a second capacitor electrode 704 are formed. The first capacitor electrode 702 and the second capacitor electrode 704 are separated by a thin, high-K spacer layer 502. In this example, the first capacitor electrode 702 is formed over a conductive feature (e.g., first VIA 306) and the second capacitor electrode 704 is formed over a second conductive feature (e.g., second VIA 308).

In the foregoing examples, the first capacitor electrode 702 was formed over a first VIA 306 and the second capacitor electrode 704 was formed over a second VIA 308. In other examples, one or more of the first capacitor electrode 702 or the second capacitor electrode 704 may not be formed over a conductive feature (e.g., first VIA 306 or second VIA 308) of an interconnection structure. In other examples, one or more of the first capacitor electrode 702 or the second capacitor electrode 704 may have a conductive feature formed in an IMD layer that is above the first IMD layer 302.

In the example of FIG. 7C, the first capacitor electrode 702 is not formed above a conductive feature. In this example, a conductive feature (e.g., VIA 732) is formed in an IMD layer above the first capacitor electrode 702 and is connected to other conductive features (e.g., metal layer 734 and VIA 736) of an interconnection structure.

Figures 8A, 8B:
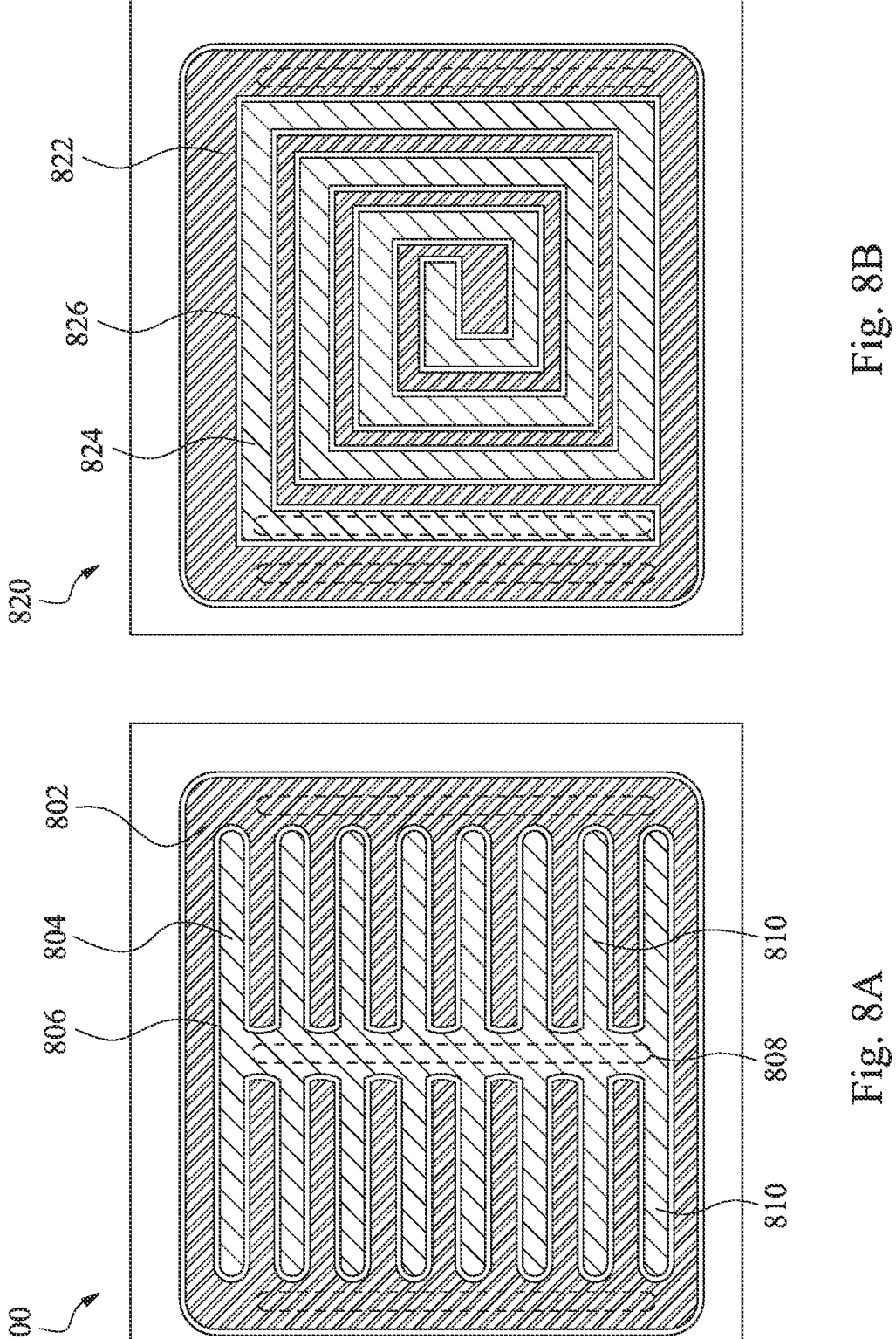

Various different layout styles may be applied to the second capacitor electrode of the vertical MIM capacitor. FIGS. 8A and 8B are top views of semiconductor structures 800, 820 having vertical MIM capacitors with a first capacitor electrode (802, 822), a second capacitor electrode (804, 824), and a high-K spacer layer (806, 826) separating the first capacitor electrode (802, 822) and the second capacitor electrode (804, 824) at vertically extending interfaces, in accordance with various embodiments. The high-K spacer layers (e.g., high-K spacer layers 502, 806, 826) have a vertically extending interface with the first capacitor electrode (e.g., first capacitor electrodes 702, 802, 822) and a vertically extending interface with the second capacitor electrode (e.g., second capacitor electrode 704, 804, 824). In the example of FIG. 7A, the second capacitor electrode 704 has a single comb-shape. In the example of FIG. 8A, the second capacitor electrode 804 has a dual comb-shape. The dual comb-shaped layout style includes a body portion 808 with a plurality of teeth 810 extending in parallel (or approximately in parallel) from the body portion 808. In the example of FIG. 8B, the second capacitor electrode 824 has a spiral shape. In other examples, other shapes are contemplated for the second capacitor electrode.

At block 214, the example process 200 includes performing further fabrication operations. A semiconductor device may undergo further processing to form various features and regions known in the art. For example, subsequent processing may form various contacts/VIAs/lines and multilayer interconnect features (e.g., metal layers and interlayer dielectrics) on the substrate, configured to connect the various features to form a functional circuit. In furtherance of the example, a multilayer interconnection may include vertical interconnects, such as VIAs or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the process 200, and some process steps described above may be replaced or eliminated in accordance with various embodiments of the process 200.

FIG. 9 is a flowchart of an example process 900 for forming a semiconductor device having a vertical MIM capacitor, in accordance with various embodiments. The process 900 is merely an example, and is not intended to limit the present disclosure beyond what is explicitly recited in the claims. Additional steps may be provided before, during, and after example process 900, and some of the steps described can be moved, replaced, or eliminated for additional embodiments of example process 900. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 900, including any descriptions given with reference to the Figures are merely exemplary and are not intended to be limiting beyond what is specifically recited in the claims that follow.

At step 910, the example process 900 includes forming, on a substrate, a device comprising a source, drain, and gate. In various embodiments, the device comprises a fin field-effect transistor (FinFET), Gate-all-around (GAA) device, nano-sheet device, 2D material device, planner device, BEOL device, NAND, 3D NAND, NMOS or PMOS, and/or complementary FET (CFET). In various embodiments the device electrically connects to an amplifier, a filter, or a memory device.

At step 920, the example process 900 includes forming a multi-layer interconnection structure configured to provide electrical connections for the source, drain, and gate, wherein the multi-layer interconnection structure has a plurality of layers at different height levels. In various embodiments, gate dielectric material of the gate comprises HfO, $HfO_2$, $SiO_2$, TaO, $Ta_2O_5$, AlO, $Al_2O_3$, SiN, ZrO, $ZrO_2$, and/or TiO. In various embodiments, the interconnection structure comprises one or more trenches. In various embodiments, a conductive feature fills the trenches of the interconnection structure. In various embodiments, the conductive feature comprises Co, Ti, TiN, W, Cu, Al, Ga, Zn, Ru, Mo, ITO, and/or a metal compound.

At step 930, the example process 900 includes forming a metal-insulator-metal (MiM) capacitor in the interconnection structure, the MiM capacitor comprising a first electrode, a high-K spacer with a first vertically-extending sidewall and a second vertically-extending sidewall wherein the first vertically-extending sidewall has a vertically extending interface with the first electrode, and a second electrode wherein the second vertically-extending sidewall has a vertically extending interface with the second electrode. In various embodiments, the high-K spacer comprises Si, O, N, Cu, Mn, C, Al, Ti, Ta, HfO, $HfO_2$, $SiO_2$, TaO, $Ta_2O_5$, AlO, $Al_2O_3$, SiN, ZrO, $ZrO_2$, or TiO. In various embodiments, the high-K spacer includes a multi-layer structure. In various embodiments, the high-K spacer has a thickness of about 1 nm to 100 nm.

At step 940, the example process 900 includes forming a first conductive feature that connects to the first electrode, and at step 950, the example process 900 includes forming a second conductive feature that connects to the second electrode. In various embodiments, the first conductive feature and the second conductive feature are formed at different layers in the interconnection structure.

In some aspects, the techniques described herein relate to a fabrication method, including: forming, on a substrate, a transistor including a source, drain, and gate; forming a multi-layer interconnection structure configured to provide electrical connections for the source, drain, and gate, wherein the multi-layer interconnection structure has a plurality of interconnection layers; and forming a metal-insulator-metal (MiM) capacitor in the interconnection structure, the MiM capacitor including a first electrode, a high-K spacer with a first vertically-extending sidewall and a second vertically-extending sidewall wherein the first vertically-extending sidewall has a vertically extending interface with the first electrode, and a second electrode wherein the second vertically-extending sidewall has a vertically extending interface with the second electrode.

In some aspects, the techniques described herein relate to a fabrication method, further including: forming a first conductive feature that connects to the first electrode; and forming a second conductive feature that connects to the second electrode; wherein forming the first conductive feature and forming the second conductive feature includes forming the first conductive feature and the second conductive features in different interconnection layers in the interconnection structure.

In some aspects, the techniques described herein relate to a fabrication method, further including: forming a first conductive feature that connects to the first electrode; and forming a second conductive feature that connects to the second electrode; wherein forming the first conductive feature and forming the second conductive feature includes forming the first conductive feature and the second conductive features in a same interconnection layer of the interconnection structure.

In some aspects, the techniques described herein relate to a fabrication method, wherein forming the MIM capacitor includes forming the first electrode, the high-K spacer, and the second electrode in a same interconnection layer of the interconnection structure.

In some aspects, the techniques described herein relate to a fabrication method, wherein forming the MIM capacitor includes: patterning a first IMD layer of the multi-layer interconnection structure to define a patterned section of the first IMD layer surrounded by an opening in the first IMD layer; forming the high-K spacer in the opening on sidewalls of the first IMD layer that face the opening; removing inner portions of the patterned section while leaving the high-K spacer; forming a barrier-seed layer on the high-K spacer and exposed portions of a second IMD layer below the first IMD layer; and forming the first electrode and the second electrode in the first IMD layer over the exposed portions of the second IMD layer.

In some aspects, the techniques described herein relate to a fabrication method, wherein the second electrode has a similar shape to the patterned section of the first IMD layer.

In some aspects, the techniques described herein relate to a semiconductor device, including: a transistor including a source, drain, and gate on a substrate; a multi-layer interconnection structure, on the substrate, configured to provide electrical connections for the source, drain, and gate, wherein the multi-layer interconnection structure has a plurality of interconnection layers; a metal-insulator-metal (MiM) capacitor, in the interconnection structure, including a first electrode, a high-K spacer, and a second electrode all formed in a same layer of the interconnection structure; a first conductive feature that connects to the first electrode; and a second conductive feature that connects to the second electrode.

In some aspects, the techniques described herein relate to a semiconductor device, wherein the high-K spacer has a first vertically-extending sidewall that has a vertically extending interface with the first electrode, and a second vertically-extending sidewall that has a vertically extending interface with the second electrode.

In some aspects, the techniques described herein relate to a semiconductor device, wherein the first conductive feature and the second conductive feature are formed in different interconnection layers in the interconnection structure.

In some aspects, the techniques described herein relate to a semiconductor device, wherein the first conductive feature and the second conductive feature are formed in a same interconnection layer of the interconnection structure.

In some aspects, the techniques described herein relate to a semiconductor device, wherein the second electrode has a single comb-like shape with a body section and a plurality of teeth sections extending out on one side of the body section in parallel from the body section.

In some aspects, the techniques described herein relate to a semiconductor device, wherein the second electrode has a double comb-like shape with a body section and a plurality of teeth sections extending out on two sides of the body section in parallel from the body section.

In some aspects, the techniques described herein relate to a semiconductor device, wherein the second electrode has a spiral-like shape.

In some aspects, the techniques described herein relate to a fabrication method, including: providing a substrate with a multi-layer interconnection structure having a first IMD layer and a second IMD layer disposed; patterning the first IMD layer of the multi-layer interconnection structure to define a patterned section of the first IMD layer surrounded by an opening in the first IMD layer; forming a high-K spacer in the opening on sidewalls of the first IMD layer that face the opening; removing inner portions of the patterned section while leaving the high-K spacer; forming a barrier-seed layer on the high-K spacer and exposed portions of the second IMD layer below the first IMD layer; and forming a first electrode and a second electrode in the first IMD layer over the exposed portions of the second IMD layer.

In some aspects, the techniques described herein relate to a fabrication method, further including: forming a first conductive feature that connects to the first electrode; and forming a second conductive feature that connects to the second electrode, wherein the first conductive feature and the second conductive feature are formed in different layers in the interconnection structure.

In some aspects, the techniques described herein relate to a fabrication method, further including: forming a first conductive feature that connects to the first electrode; and forming a second conductive feature that connects to the second electrode, wherein the first conductive feature and the second conductive feature are formed in a same layer in the interconnection structure.

In some aspects, the techniques described herein relate to a fabrication method, wherein the second electrode has a shape similar to the patterned section of the first IMD layer.

In some aspects, the techniques described herein relate to a fabrication method, wherein the second electrode has a single comb-like shape with a body section and a plurality of teeth sections extending out on one side of the body section in parallel from the body section.

In some aspects, the techniques described herein relate to a fabrication method, wherein the second electrode has a double comb-like shape with a body section and a plurality of teeth sections extending out on two sides of the body section in parallel from the body section.

In some aspects, the techniques described herein relate to a fabrication method, wherein the second electrode has a spiral-like shape.

In some aspects, the techniques described herein relate to a fabrication method, including: forming, on a substrate, a transistor including a source, drain, and gate; forming a multi-layer interconnection structure configured to provide electrical connections for the source, drain, and gate, wherein the multi-layer interconnection structure has a plurality of layers at different height levels; forming a comb-shaped feature in the interconnection structure; forming a high-K insulation feature on sidewalls of the comb-shaped feature; removing inner portions of the comb feature while keeping the high-K insulation feature; forming a barrier-seed layer on the high-K insulation feature; filling a conductive feature on the barrier-seed layer; performing chemical mechanical polishing operations on the conductive feature to form a first conductive feature, the high-K insulation feature, and a second conductive feature.

In some aspects, the techniques described herein relate to a fabrication method, including: forming, on a substrate, a transistor including a source, drain, and gate; forming a multi-layer interconnection structure configured to provide electrical connections for the source, drain, and gate, wherein the multi-layer interconnection structure has a plurality of interconnection layers; forming a metal-insulator-metal (MiM) capacitor in the interconnection structure, the MiM capacitor including a first electrode, a high-K spacer with a first vertically-extending sidewall and a second vertically-extending sidewall wherein the first vertically-extending sidewall has a vertically extending interface with the first electrode, and a second electrode wherein the second vertically-extending sidewall has a vertically extending interface with the second electrode; forming a first conductive feature that connects to the first electrode; and forming a second conductive feature that connects to the second electrode; wherein the first connective feature and the second connective feature are at the same interconnection layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method, comprising:

forming, on a substrate, a transistor comprising a source, drain, and gate;

forming a multi-layer interconnection structure configured to provide electrical connections for the source, drain, and gate, wherein the multi-layer interconnection structure has a plurality of interconnection layers; and forming a metal-insulator-metal (MiM) capacitor in the interconnection structure, the MiM capacitor comprising a first electrode, a second electrode, and a high-K spacer having a first vertically-extending sidewall and a second vertically-extending sidewall disposed between the first electrode and the second electrode, wherein:

the first electrode, the second electrode, and the high-K spacer extend from a top surface of a first intermetal dielectric (IMD) layer to a bottom surface of the first IMD layer; and the first vertically-extending sidewall has a vertically extending interface with the first electrode, and the second vertically-extending sidewall has a vertically extending interface with the second electrode.

2. The method of claim 1, further comprising:

forming a first conductive feature that connects to the first electrode; and forming a second conductive feature that connects to the second electrode;

wherein forming the first conductive feature and forming the second conductive feature comprises forming the first conductive feature and the second conductive features in different interconnection layers in the interconnection structure.

3. The method of claim 1, further comprising:

forming a first conductive feature that connects to the first electrode; and forming a second conductive feature that connects to the second electrode;

wherein forming the first conductive feature and forming the second conductive feature comprises forming the first conductive feature and the second conductive features in a same interconnection layer of the interconnection structure.

4. The method of claim 1, wherein forming the MiM capacitor comprises forming the first electrode, the high-K spacer, and the second electrode in a same interconnection layer of the interconnection structure.

5. The method of claim 1, wherein forming the MiM capacitor comprises:

patterning a first IMD layer of the multi-layer interconnection structure to define a patterned section of the first IMD layer surrounded by an opening in the first IMD layer;

forming the high-K spacer in the opening on sidewalls of the first IMD layer that face the opening;

removing inner portions of the patterned section while leaving the high-K spacer;

forming a barrier-seed layer on the high-K spacer and exposed portions of a second IMD layer below the first IMD layer; and forming the first electrode and the second electrode in the first IMD layer over the exposed portions of the second IMD layer.

6. The method of claim 5, wherein the second electrode has a similar shape to the patterned section of the first IMD layer.

7. A semiconductor device, comprising:

a transistor comprising a source, drain, and gate on a substrate;

a multi-layer interconnection structure, on the substrate, configured to provide electrical connections for the source, drain, and gate, wherein the multi-layer interconnection structure has a plurality of interconnection layers;

a metal-insulator-metal (MiM) capacitor, in the interconnection structure, comprising a first electrode, a high-K spacer, and a second electrode all extending from a top surface of a first intermetal dielectric (IMD) layer to a bottom surface of the first IMD layer;

a first conductive feature that connects to the first electrode; and a second conductive feature that connects to the second electrode.

8. The semiconductor device of claim 7, wherein the high-K spacer has a first vertically-extending sidewall that has a vertically extending interface with the first electrode, and a second vertically-extending sidewall that has a vertically extending interface with the second electrode.

9. The semiconductor device of claim 7, wherein the first conductive feature and the second conductive feature are formed in different interconnection layers in the interconnection structure.

10. The semiconductor device of claim 7, wherein the first conductive feature and the second conductive feature are formed in a same interconnection layer of the interconnection structure.

11. The semiconductor device of claim 7, wherein the second electrode has a single comb-like shape with a body section and a plurality of teeth sections extending out on one side of the body section in parallel from the body section.

12. The semiconductor device of claim 7, wherein the second electrode has a double comb-like shape with a body section and a plurality of teeth sections extending out on two sides of the body section in parallel from the body section.

13. The semiconductor device of claim 7, wherein the second electrode has a spiral-like shape.

14. A method, comprising:

providing a substrate with a multi-layer interconnection structure having a first IMD layer and a second IMD layer;

patterning the first IMD layer of the multi-layer interconnection structure to define a patterned section of the first IMD layer surrounded by an opening in the first IMD layer;

forming a high-K spacer in the opening on sidewalls of the first IMD layer that face the opening;

removing inner portions of the patterned section while leaving the high-K spacer;

forming a barrier-seed layer on the high-K spacer and exposed portions of the second IMD layer below the first IMD layer; and forming a first electrode and a second electrode in the first IMD layer over the exposed portions of the second IMD layer.

15. The method of claim 14, further comprising: forming a first conductive feature that connects to the first electrode; and forming a second conductive feature that connects to the second electrode, wherein the first conductive feature and the second conductive feature are formed in different layers in the interconnection structure.

16. The method of claim 14, further comprising: forming a first conductive feature that connects to the first electrode; and forming a second conductive feature that connects to the second electrode, wherein the first conductive feature and the second conductive feature are formed in a same layer in the interconnection structure.

17. The method of claim 14, wherein the second electrode has a shape similar to the patterned section of the first IMD layer.

18. The method of claim 14, wherein the second electrode has a single comb-like shape with a body section and a plurality of teeth sections extending out on one side of the body section in parallel from the body section.

19. The method of claim 14, wherein the second electrode has a double comb-like shape with a body section and a plurality of teeth sections extending out on two sides of the body section in parallel from the body section.

20. The method of claim 14, wherein the second electrode has a spiral-like shape.

* * * * *